United States Patent
Chang et al.

(10) Patent No.: US 6,414,379 B1
(45) Date of Patent: Jul. 2, 2002

(54) STRUCTURE OF DISTURBING PLATE HAVING DOWN SET

(75) Inventors: Yueh-Chiung Chang, Kaohsiung Hsien; Ya-Yi Lai; Chih-Tsung Hou, both of Taichung Hsien; Kun-Ming Huang, Changhua; Ching-Kun Yeh, Taichung, all of (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/676,595

(22) Filed: Sep. 29, 2000

(51) Int. Cl.[7] .............................................. H01L 23/495
(52) U.S. Cl. ...................... 257/666; 257/667; 257/787; 257/670; 257/673; 257/674
(58) Field of Search ................................ 257/667, 670, 257/666, 787, 673, 674

(56) References Cited

U.S. PATENT DOCUMENTS 5,530,286 A * 6/1996 Murakami et al. .......... 257/692
5,932,923 A * 8/1999 Kim et al. .................. 257/667

* cited by examiner

Primary Examiner—David L. Talbott
Assistant Examiner—Luan Thai
(74) Attorney, Agent, or Firm—J.C. Patents

(57) ABSTRACT

A disturbing plate structure having at least one down set, applicable in a lead frame-type package in a semiconductor. The disturbing plate has at least a lead frame, a die, a glue layer, a plurality of disturbing plates, a top mold compound, and a bottom mold compound. The lead frame has a plurality of leads. Two disturbing plates are located on two sides of the die. A space is formed by bending a first bent portion and a second bent portion of the disturbing plate down. Finally, the lead frame is encapsulated with a mold compound. By adjusting the size of the space formed by the first bent portion and the second bent portion, the top mold compound section has substantially the same volume as the bottom mold compound section to finish the packaging and forming.

8 Claims, 2 Drawing Sheets

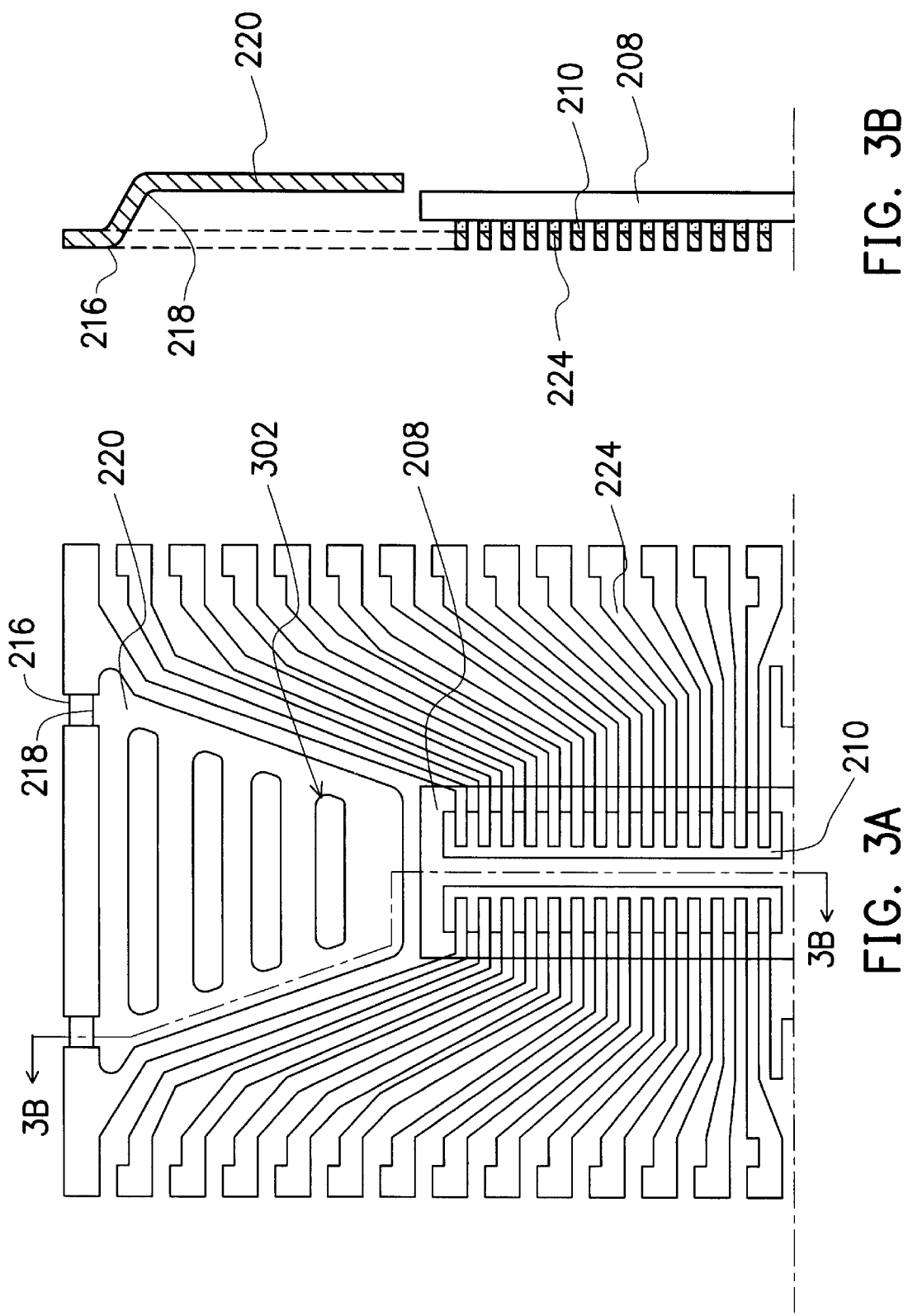

STRUCTURE OF DISTURBING PLATE HAVING DOWN SET

BACKGROUND OF THE INVENTION

1. Field of the Invention

The present invention relates to a structure of a disturbing plate having at least one down set. More specifically, the present invention relates to a structure of a disturbing plate useful for the lead frame type package in the semiconductor device.

2. Description of the Related Art

In the ever-expanding world of information, the integrated circuit is an inseparable part of daily life. Food, clothing, residence, business, education, and amusement are just some of the areas which often use products made with integrated circuits. Following instant development, greater user-friendliness, increased usefulness and higher complexity in electronic products, as well as a trend towards lightness and smallness in design, use of electronic products has become more convenient and comfortable.

In the semiconductor fabricating process, a semiconductor product having higher integration is available because of mass production of the 0.18 micrometer integrated circuit. The integrated circuit fabrication process includes three major stages: production of a silicon chip, production of an integrated circuit and packaging of the integrated circuit, after which packaging the manufacture of the integrated circuit is complete. It is the object of the package to provide a medium for electrically connecting a die to a printed circuit board or other suitable components and to provide protection for the die.

After the process of fabricating a semiconductor is completed, the wafer is cut into dies. A bonding pad is usually provided in the periphery of the die as a testing point for detection of the die and a terminal for connection of the die to other components. A wire or a bump must be used as a connection medium to connect the die to other components.

Current methods of packaging a common semiconductor memory, such as a Dynamic Random Access Memory (DRAM), include Small Outline J-Lead (SOJ) and Thin Small Outline Package (TSOP).

It is noted that an SOJ or a TSOP includes a Lead On Chip (LOC) or a Chip On Lead (COL) packaging manner in view of the location of the lead frame. The LOC is used mainly as a package for Dynamic Random Access Memory (DRAM), as provided by IBM in U.S. Pat. No. 4,862,245 (1998), and is superior for its high transmitting speed, good heat dissipation and compact size. The COL is a lead frame as disclosed in U.S. Pat. No. 4,989,068, for example.

FIG. 1 is a schematic cross-sectional view of a conventional small out-line package LOC. As exemplified by a conventional Lead On Chip (LOC), a die 108 is attached under leads 109 by a glue layer 110. Then, the die 108 is encapsulated with mold compound having a top mold compound section 106 and a bottom mold compound section 102 to form a package. The top mold compound section 106 has a thickness 116. The bottom mold compound section 102 has a thickness 114. The ratio of the thickness 116 to the thickness 114 is about 1:3. Because the top section 106 and the bottom section 102 have different thicknesses and volumes, they exhibit different degrees of shrinkage during cooling, resulting in warpage of the whole package.

SUMMARY OF THE INVENTION

Accordingly, the present invention provides a structure of a disturbing plate having at least one down set to achieve equal volumes of the top and bottom sections of the mold compound such that equivalent shrinkage thereof is obtained when cooling occurs to prevent warpage of the packaging elements.

According to the above and other objects of the present invention, a disturbing plate structure having at least one down set applicable in a lead frame-type package in a semiconductor is provided. Such a structure comprises at least a lead frame, a die, a glue layer, a plurality of disturbing plates, a top mold compound, and a bottom mold compound. The lead frame has a plurality of leads under which the die is attached by the glue layer. Two disturbing plates are located on two sides of the die. A space is formed by bending a first bent portion and a second bent portion of the disturbing plate down. Finally, the lead frame is encapsulated with a mold compound.

According to one preferred embodiment of the present invention, in the structure of the disturbing plate having at least one down set, applicable in semiconductor leadframe packaging, the first bent portion and the second bent portion of the disturbing plate can be bent to adjust the size of the space, such that the top mold compound section has substantially the same volume as the bottom mold compound section. This equalizes the degree of shrinkage during cooling, thus avoiding warpage of the packaging element.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

FIG. 3A is a top view of a structure of a disturbing plate having at least one down set according to one preferred embodiment of the present invention;

FIG. 3B is a partial cross-sectional view of a structure of a disturbing plate having at least one down set according to one preferred embodiment of the present invention.

DESCRIPTION OF THE PREFERRED EMBODIMENT

Figure 1:
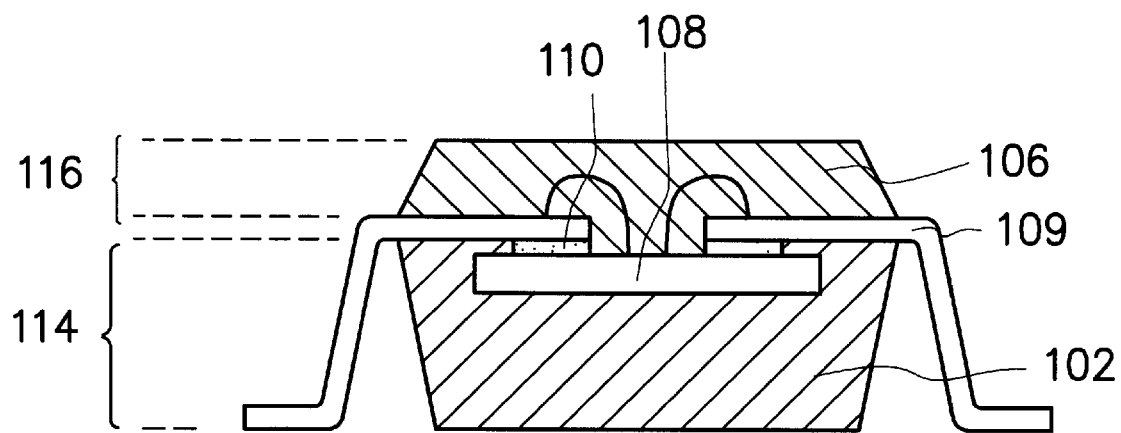
FIG. 1 is a schematic cross-sectional view of a small out-line package LOC in the art.
Figure 2:
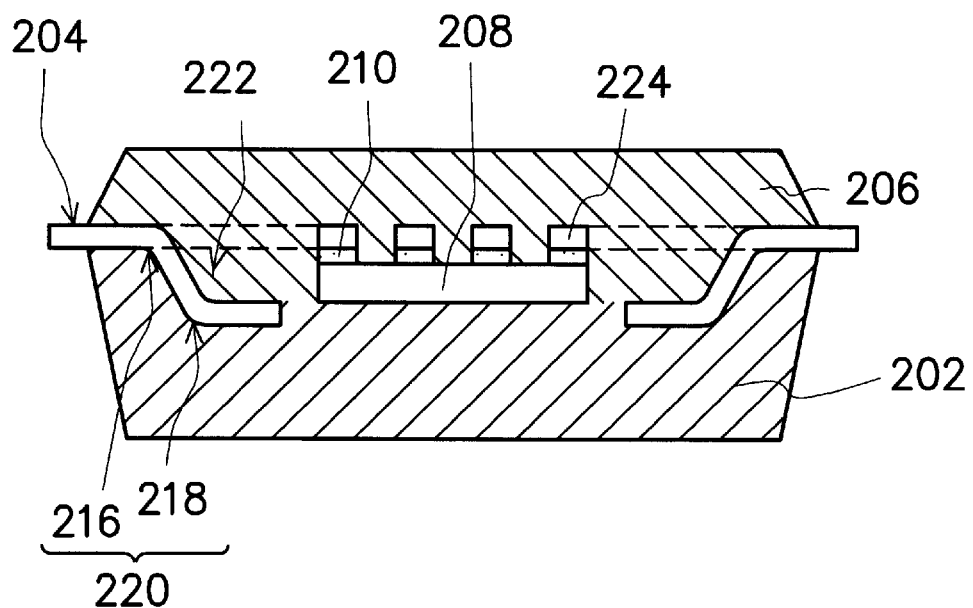
FIG. 2 is a schematic cross-sectional view of a structure of a disturbing plate having at least one down set according to one of preferred embodiments of the present invention.

FIG. 2 is a schematic, cross-sectional view of a structure of a disturbing plate having at least one down set according to one preferred embodiment of the present invention. In this embodiment, a structure having a carrier such as a lead frame and having Lead On Chip (LOC) is exemplified for illustration.

As shown in FIG. 2, the structure of the disturbing plate having at least one down set according to the present invention, applicable in semiconductor lead frame-type packages, comprises at least a lead frame 204, a die 208, a glue layer 210, a plurality of disturbing plates 220, a top mold compound section 206, and a bottom mold compound section 202. The lead frame 204 has a plurality of leads 224.

The lead frame 204 is used as a carrier in the structure of the disturbing plate having at least one down set according to the present invention. The lead frame 204 includes a plurality of leads 224 under which a die 208 is attached by the glue layer 210. The glue layer 210 can be formed of polyimide or a non-conductive adhesive, for example. The leads 224 can include inner leads and outer leads. The die 208 can be various integrated circuit chips, such as a Dynamic Random Access Memory (DRAM), a Read-Only Memory (ROM), a Static Random Access Memory (SRAM), a Flash memory, a Logic Circuit Chip (LOGIC) or a Analog Chip (ANALOG). The surface of the die 208 has a plurality of pads located thereon. The electric connection of the die 208 to the lead frame 204 can be achieved by conventional wire bonding with wire-type conductive material, such as gold wire, aluminum wire or other metal wire, to electrically connect the pads to the inner leads of the leads 224.

Two disturbing plates 220 are provided on two sides of the die 208. A space is formed by bending a first bent portion 216 and a second bent portion 218 of the disturbing plate 220 down. Finally, the lead frame 204 is encapsulated with a mold compound. By adjusting the size of the space 222 formed by the first bent portion 216 and the second bent portion 218, the top mold compound section 206 has substantially the same volume as the bottom mold compound section 202 to finish the packaging and forming.

The top mold compound section 206 and the bottom mold compound section 202, including isolating material such as epoxy resin, have substantially the same volume, thereby resulting in substantially equivalent shrinkage during cooling. Warpage of the packaging elements is thereby prevented.

A top view of a structure of a disturbing plate having at least one down set according to one preferred embodiment of the present invention is shown in FIG. 3A.

As shown in FIG. 3A, the bent down portion of disturbing plate 220 further includes a plurality of openings 302 to enhance the structural strength of the package element and to improve the stress distribution without affecting flow conditions.

FIG. 3B is a partial cross-sectional view taken along line 3B—3B in FIG. 3A. The subsequent forming of bent outer leads, and the connection of the outer leads to a circuit board by surface mount technique (SMT) are not detailed here as they are well known to persons skilled in the relevant art.

In summary, the present invention has the following advantages:
1. Two disturbing plates are provided on two sides of the conventional lead frame to form a space by bending the first bent portion and the second bent portion down. Thereby, the ratio of the top mold compound section to the bottom mold compound section in volume can be balanced to result in substantially equivalent shrinkage during cooling. The package are thus prevented from warpage.
2. A plurality of openings is provided in the disturbing plate to enhance the structural strength of the package element and to improve the stress distribution, without affecting flow.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A disturbing plate structure having at least one down set, applicable in a lead frame-type package in a semiconductor, comprising:
   a lead frame having a plurality of leads;
   a die having an active surface attached to the leads of the lead frame;
   a plurality of disturbing plates located on two sides of the die, the disturbing plates each having at least a first bent portion and a second bent portion;
   a mold compound, including a top mold compound section and a bottom mold compound section for encapsulating the lead frame,
      wherein the first bent portion and the second bent portion form a space and the top mold compound section has substantially the same volume as the bottom mold compound section by adjusting the size of the space.

2. The structure according to claim 1, wherein the mold compound includes epoxy resin.

3. The structure according to claim 1, wherein the disturbing plate further comprises a plurality of openings.

4. A disturbing plate structure having at least one down set, applicable in a lead frame-type package in a semiconductor, comprising:
   a lead frame having a plurality of leads;
   a die having an active surface attached to the leads of the lead frame;
   a glue layer located between the die and the leads of the lead frame to attach the die to the leads;
   a plurality of disturbing plates located on two sides of the die, the disturbing plates each having at least a first bent portion and a second bent portion;
   a mold compound, including a top mold compound section and a bottom mold compound section for encapsulating the lead frame; wherein the first bent portion and the second bent portion form a space and the top mold compound section has substantially the same volume as the bottom mold compound section by adjusting the size of the space.

5. The structure according to claim 4, wherein the mold compound includes epoxy resin.

6. The structure according to claim 4, wherein the glue layer is made of polyimide.

7. The structure according to claim 4, wherein the glue layer is made of a material having ho electric conductance.

8. The structure according to claim 4, wherein the disturbing plate further comprises a plurality of openings.

* * * * *